(12) United States Patent
Ozawa et al.

(10) Patent No.: US 9,691,964 B2
(45) Date of Patent: Jun. 27, 2017

(54) PIEZOELECTRIC ELEMENT UNIT AND DRIVING DEVICE

(71) Applicant: TDK CORPORATION, Minato-ku, Tokyo (JP)

(72) Inventors: Satoshi Ozawa, Tokyo (JP); Atsushi Tamura, Tokyo (JP); Akio Abe, Tokyo (JP); Kohsuke Shimazaki, Tokyo (JP); Haruo Taguchi, Tokyo (JP)

(73) Assignee: TDK Corporation, Tokyo (JP)

( * ) Notice: Subject to any disclaimer, the term of this patent is extended or adjusted under 35 U.S.C. 154(b) by 196 days.

(21) Appl. No.: 14/604,271

(22) Filed: Jan. 23, 2015

(65) Prior Publication Data

US 2015/0243876 A1    Aug. 27, 2015

(30) Foreign Application Priority Data

Feb. 27, 2014  (JP) ................................. 2014-037190
Aug. 7, 2014   (JP) ................................. 2014-161911

(51) Int. Cl.
*H01L 41/083*    (2006.01)
*H01L 41/053*    (2006.01)
*H02N 2/02*      (2006.01)
*H01L 41/313*    (2013.01)

(52) U.S. Cl.
CPC ........ *H01L 41/0533* (2013.01); *H01L 41/083* (2013.01); *H02N 2/025* (2013.01); *H01L 41/313* (2013.01)

(58) Field of Classification Search
CPC .......................... H01L 41/083; H01L 41/0838

USPC .......................................................... 310/328
See application file for complete search history.

(56) References Cited

U.S. PATENT DOCUMENTS

| | | | |
|---|---|---|---|
| 2003/0107301 A1* | 6/2003 | Asano | H01L 41/083 310/328 |
| 2013/0233278 A1* | 9/2013 | Sato | H01L 41/0472 123/456 |
| 2014/0167568 A1* | 6/2014 | Ozawa | H01L 41/0475 310/364 |

FOREIGN PATENT DOCUMENTS

| | | | |
|---|---|---|---|
| JP | 02276280 A | * | 11/1990 |
| JP | 2000-307161 A | | 11/2000 |
| JP | 2002-119074 A | | 4/2002 |
| JP | 2002-232994 A | | 8/2002 |
| JP | 2011-176187 A | | 9/2011 |
| JP | 2013-222713 A | | 10/2013 |

* cited by examiner

*Primary Examiner* — J. San Martin
(74) *Attorney, Agent, or Firm* — Arent Fox LLP

(57) ABSTRACT

A piezoelectric element unit comprises an element body having an active part and an inactive part; and a first resin part bonding one end surface in the laminating direction of the element body to a mounting surface of a joint member placed to face the one end surface. The first resin part covers the mounting surface up to an outer side surface of the element body corresponding to an interface between the active part and the inactive part, a second resin part covers an outer surface of the first resin part covering the outer side surface of the element body at a position corresponding to the interface between the active part and the inactive part, and the second resin part also integrally covers the outer side surface of the element body corresponding to the active part.

15 Claims, 13 Drawing Sheets

PIEZOELECTRIC ELEMENT UNIT AND DRIVING DEVICE

BACKGROUND OF THE INVENTION

1. Field of the Invention

The present invention relates to a piezoelectric element unit preferably used for such as a part of a driving device for driving a driven member and to a driving device therewith.

2. Description of the Related Art

Piezoelectric elements can mutually convert mechanical displacement to or from electronic displacement by utilizing piezoelectric effects or inverse piezoelectric effects. These piezoelectric elements are manufactured by molding and firing piezoelectric ceramics to obtain an element body, forming electrodes thereto, and further performing polarization treatment, for example.

Since the mechanical displacement obtained by the piezoelectric elements is comparatively small, the piezoelectric elements are preferably used as a driving device for which a precise and accurate control is required, for example. More specifically, the piezoelectric elements are used for lens drives, head drives of HDDs, head drives for ink jet printers, fuel injection valve drives, and the like.

For example, as a driving device with a piezoelectric element, one having a structure where a driving rod and a support table are respectively adhered to both ends of the piezoelectric element is disclosed (see Patent Literature 1 or so).

However, conventional multi-layered piezoelectric elements may be broken by a large load generated at the time of driving and so on or by some external force when they are particularly used for a purpose requiring a severe durability.
[Patent Literature 1] JP Patent Application Laid Open No. 2002-119074

SUMMARY OF THE INVENTION

The object of the present invention is to provide a piezoelectric element unit which can improve a mechanical strength with a simple structure and to provide a driving device having the piezoelectric element unit.

As a result of intensive studies, the present inventors have found that the most weakened part is an interface between an active part and an inactive part and they have accomplished the present invention.

That is, a piezoelectric element unit according to the present invention comprising:

an element body having an active part in which piezoelectric layers and internal electrodes are laminated alternatively and an inactive part laminated at both ends of the active part in a laminating direction; and a first resin part bonding one end surface in the laminating direction of the element body to a mounting surface of a joint member placed to face the one end surface, wherein the first resin part covers the mounting surface up to an outer side surface of the element body corresponding to an interface between the active part and the inactive part, a second resin part covers an outer surface of the first resin part covering the outer side surface of the element body at a position corresponding to the interface between the active part and the inactive part, and the second resin part also integrally covers the outer side surface of the element body corresponding to the active part.

In the piezoelectric element unit, the outer side surface of the element body is doubly covered by the first resin part and the second resin part at a position corresponding to the interface between the active part and the inactive part. That is, in the piezoelectric element unit of the present invention, the most weakened part of the element body is doubly covered by the first resin part and the second resin part. Thus, in the present invention, with a simple structure, a mechanical strength (e.g., bending strength) of the element body can be improved, the element body is hard to be broken, and durability thereof is improved.

The first resin part also joins the element body and the joint member, which allows the piezoelectric element unit according to the present invention to have a simple structure, easy manufacturing, and excellent reliability.

Further, the second resin part integrally covers the outer side surfaces of the element body corresponding to the active part as well. Thus, a boundary between a rim part of the first resin part and the outer side surfaces of the element body is covered by the second resin part. As a result, the rim part of the first resin part can be prevented from peeling off from the outer side surfaces of the element body. The second resin part also integrally covers the outer side surfaces of the element body corresponding to the active part, which improves humidity resistance.

An elastic modulus of the first resin part may be larger than that of the second resin part. A main component may be the same or different between synthetic resin constituting the first resin part and synthetic resin constituting the second resin part. The following effects are demonstrated by changing elastic modulus.

That is, the element body is caused to move by voltage applied to internal electrodes, but the move does not occur at the inactive part. Then, with a low elastic modulus of the second resin part, it becomes easier for the second resin part to follow the move of the active part, and durability of the second resin part is improved. Further, the first resin part located at the inactive part also joins the element body to the joint member, which allows a harder one compared with the second resin part to join them firmly. In addition, there is no problem even if the first resin part is hard because the inactive part itself does not move.

External electrodes may be respectively formed on two opposite side surfaces of the element body and the second resin part may also cover outer surfaces of the external electrodes. By having such a structure, the external electrodes are effectively protected, and gas corrosion of the external electrodes or so can be prevented.

A lead part for wiring may be fixed by an electric connection part to nearby the mounting surface on the outer surfaces of the external electrodes and the electric connection part may be doubly covered by the first resin part and the second resin part. By having such a structure, strength of the element body is also improved at the electric connection part.

Also, a lead part for wiring may be fixed by an electric connection part to the outer surfaces of the external electrodes corresponding to the active part and the electric connection part may be covered by the second resin part. By having such a structure, strength of the element body is also improved at the electric connection part.

The electric connection part may be either a solder or a conductive adhesive agent. Also, the joint member may be either a weight or a driving shaft.

A driving device according to the present invention comprises the piezoelectric element unit mentioned above.

DESCRIPTION OF THE PREFERRED EMBODIMENTS

Hereinafter, embodiments of the present invention will be described based on the figures.

First Embodiment

Figure 1:
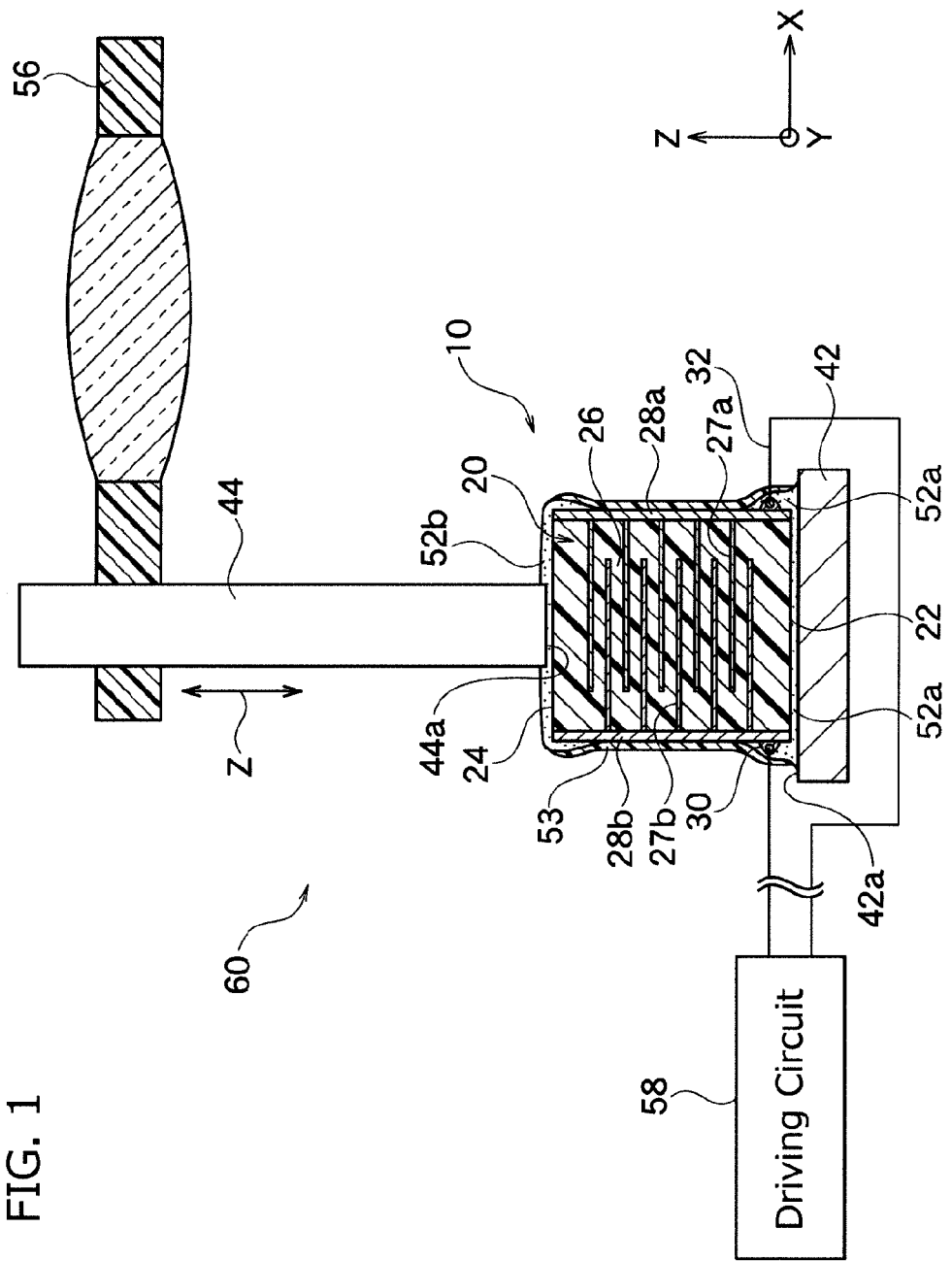
FIG. 1 is a schematic view of a partial cross section view of a piezoelectric element unit according to one embodiment of the present invention.

FIG. 1 is a conceptual view showing a lens driving device 60 utilizing a piezoelectric element unit 10 according to one embodiment of the present invention. The lens driving device 60 includes a movable member 56 and a driving circuit 58 as well as the piezoelectric element unit 10. The movable member 56 is movably engaged with a shaft 44. The driving circuit 58 applies voltage to an element body 20. The movable member 56 holds a lens. The movable member 56 and the lens held thereby can relatively move to the shaft 44 along an axis (Z-axis) of the shaft 44.

The piezoelectric element unit 10 includes the element body 20 composed of a multilayer piezoelectric element, a weight 42, and the shaft 44. The piezoelectric element unit 10 further includes wiring parts 32 and electric connection parts 30. The wiring parts 32 electrically connect the element body 20 and the driving circuit 58. The electric connection parts 30 connect the wiring parts 32 to first and second external electrodes 28a and 28b, respectively. The electric connection parts 30 are respectively composed of such as a solder or a conductive adhesive agent.

The element body 20 is deformed by voltage applied by the driving circuit 58. Then, the shaft 44 connected to the element body 20 shows a reciprocating movement (vibration) in the Z-axis direction. A voltage waveform outputted from the driving circuit 58 is not particularly limited. The driving circuit 58 outputs a voltage waveform such as a sawtooth wave, which enables the movable member 56 to generate a movement amount exceeding both deformation amount of the piezoelectric element unit 10 and displacement amount of the shaft 44.

Note that, in the present embodiment, the present invention will be described by exemplifying an embodiment applying the piezoelectric element unit 10 to the lens driving device 60. However, a device including the piezoelectric element unit 10 is not limited thereto, and the piezoelectric element unit 10 can be also included by other driving devices or so.

Figure 3:
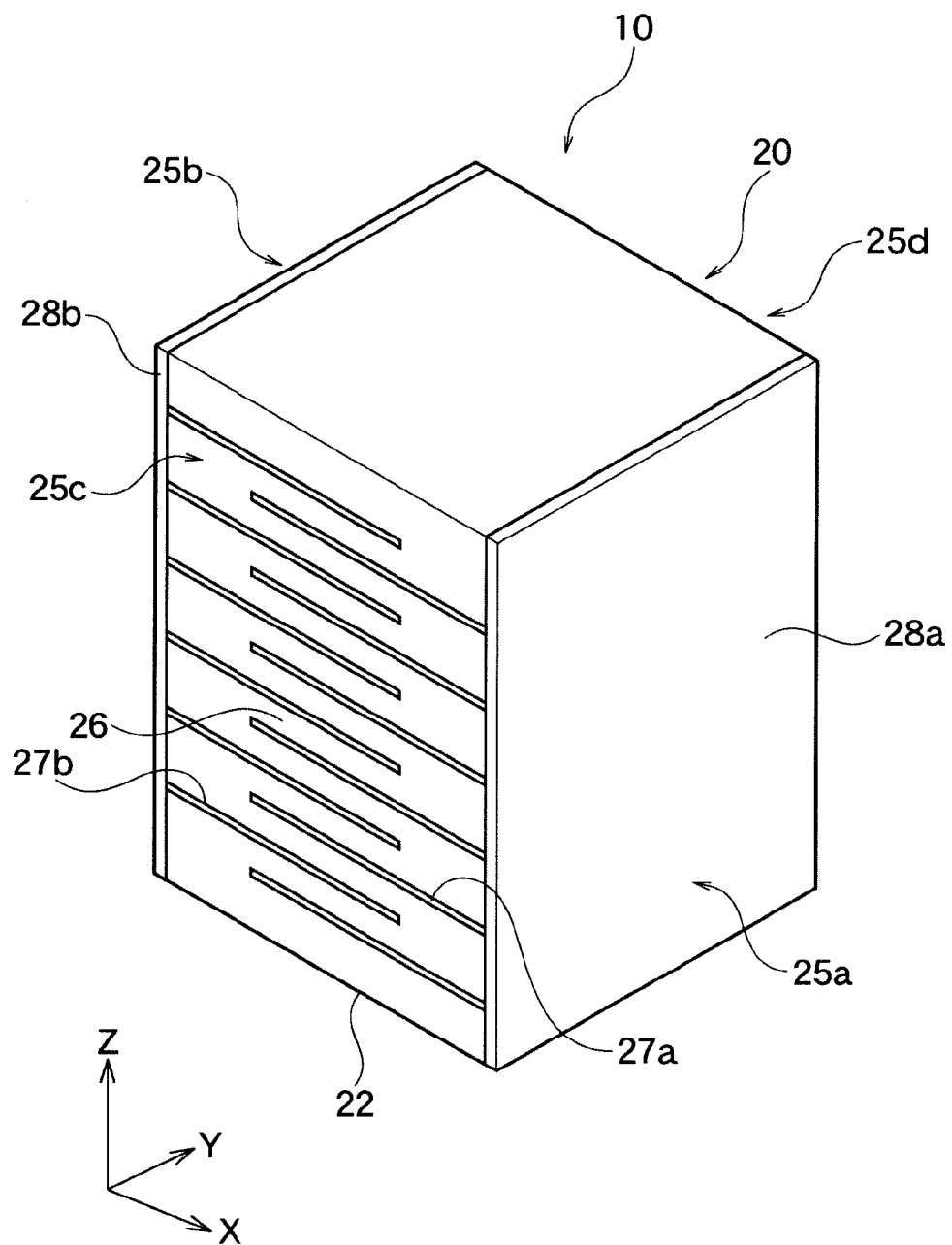
FIG. 3 is a perspective view of an element body of the piezoelectric element unit shown in FIG. 1 and FIG. 2.

As shown in FIG. 1 and FIG. 3, the element body 20 of the piezoelectric element unit 10 has an approximately prismatic (square column in the present embodiment) outer shape. The element body 20 of the piezoelectric element unit 10 has piezoelectric layers 26, first and second internal electrodes 27a and 27b, and the first and second external electrodes 28a and 28b. Note that, the outer shape of the element body 20 is not limited to prism and may be circular column, elliptic column, or other shapes.

The first internal electrodes 27a and the second internal electrodes 27b are alternatively laminated with the piezoelectric layers 26 therebetween inside the element body 20. The first external electrode 28a and the second external electrode 28b are formed on side surfaces extending along a laminating direction (Z-axis) of the element body 20. As shown in FIG. 3, the first external electrode 28a is formed on a first side surface 25a extending along the laminating direction, and the second external electrode 28b is formed on a second side surface 25b opposing to the first side surface 25a in the X-axis direction.

The first internal electrodes 27a are electrically connected to the first external electrode 28a. The second internal electrodes 27b are electrically connected to the second external electrode 28b. With respect to the side surfaces of the element body 20, resin layers for preventing migration may be formed beforehand on a third side surface 25c and a fourth side surface 25d (facing the Y-axis direction), where the first and second external electrodes 28a and 28b are not formed. Note that, in the present embodiment, the resin layers for preventing migration can be omitted because the following resin layers composed of the second resin parts 53 can also prevent migration.

Note that, in the figures, the X-axis, Y-axis, and Z-axis are respectively vertical to each other. The Z-axis corresponds to the laminating direction of the element body 20 and to an axial direction of the shaft. The X-axis corresponds to an opposing direction of the first external electrode 28a and the second external electrode 28b.

A conductive material constituting the first internal electrodes 27a and the second internal electrodes 27b is not particularly limited. For example, noble metal such as Ag, Pd, Au, or Pt, alloy thereof (Ag—Pd or so), base metal such as Cu or Ni, and alloy thereof are exemplified as the conductive material. A conductive material constituting the first external electrode 28a and the second external electrode 28b is not particularly limited, either. The same material as the conductive material constituting the internal electrodes may be used. Note that, plating layers or sputtered layers of each metal mentioned above may be formed on the most outer surfaces of the first external electrode 28a and the second external electrode 28b.

A material of the piezoelectric layers 26 is not particularly limited as long as it shows piezoelectric effects or inverse piezoelectric effects, and $PbZr_x Ti_{1-x} O_3$ and $BaTiO_3$ etc. are exemplified. The material may include a component for property improvement or so, and the content amount may be properly determined based on a desired property.

Figure 2:
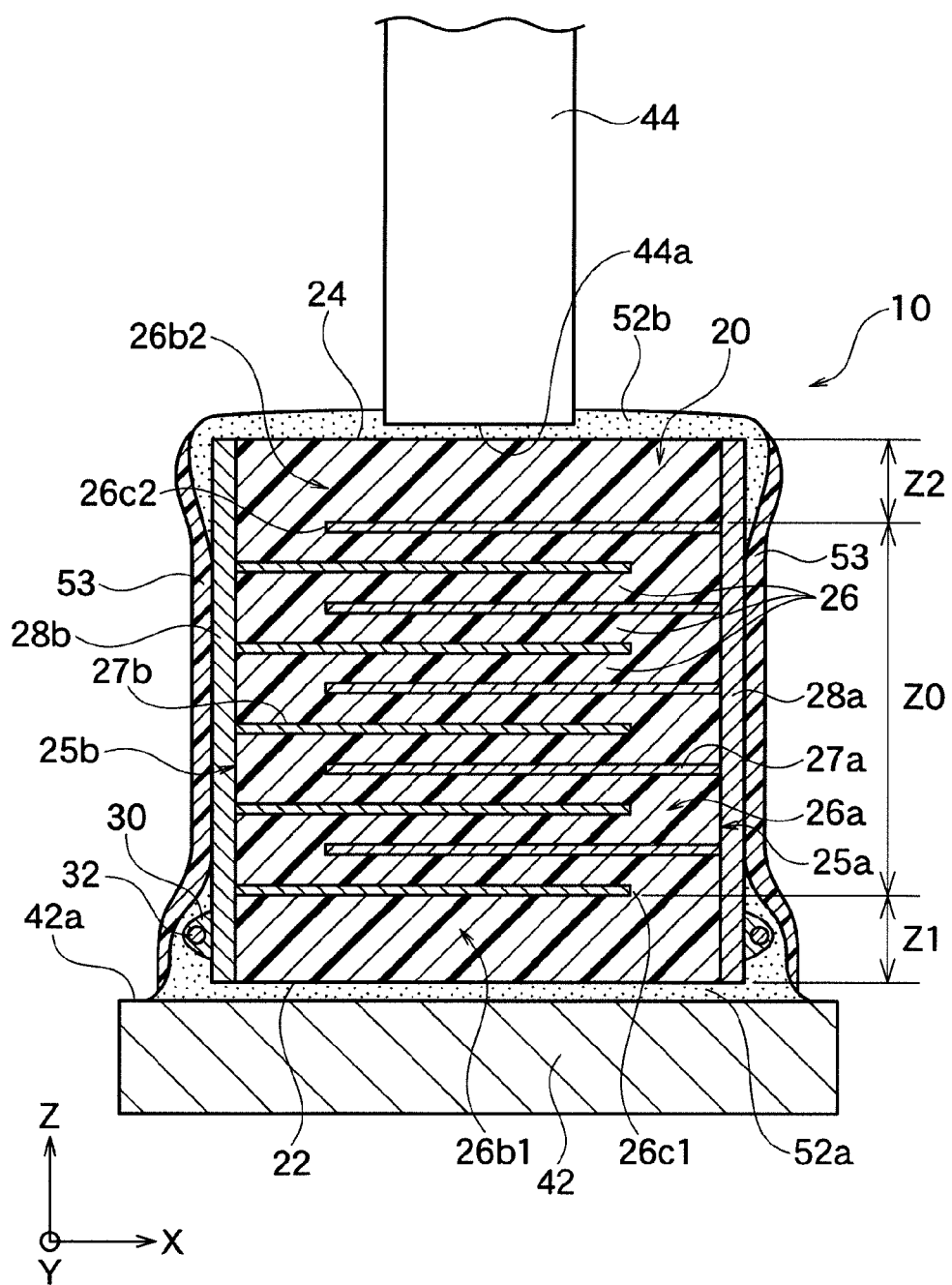
FIG. 2 is an enlarged cross sectional view of a main part of the piezoelectric element unit shown in FIG. 1.

As shown in FIG. 1 and FIG. 2, in the piezoelectric element unit 10, a first mounting surface 42a of the weight 42 is placed to face a first end surface 22, which is one end surface in the laminating direction of the element body 20. The first end surface 22 and the first mounting surface 42a are joined by a first resin part 52a. The element body 20 and the weight 42 are mutually fixed by the first resin part 52a.

The wiring part 32 is connected to the first external electrode 28a through the electric connection part 30. Note that, as with the first external electrode 28a, the wiring part 32 is also connected to the second external electrode 28b, which is formed on a side surface opposite to the first external electrode 28a, through the electric connection part 30.

Figure 4:
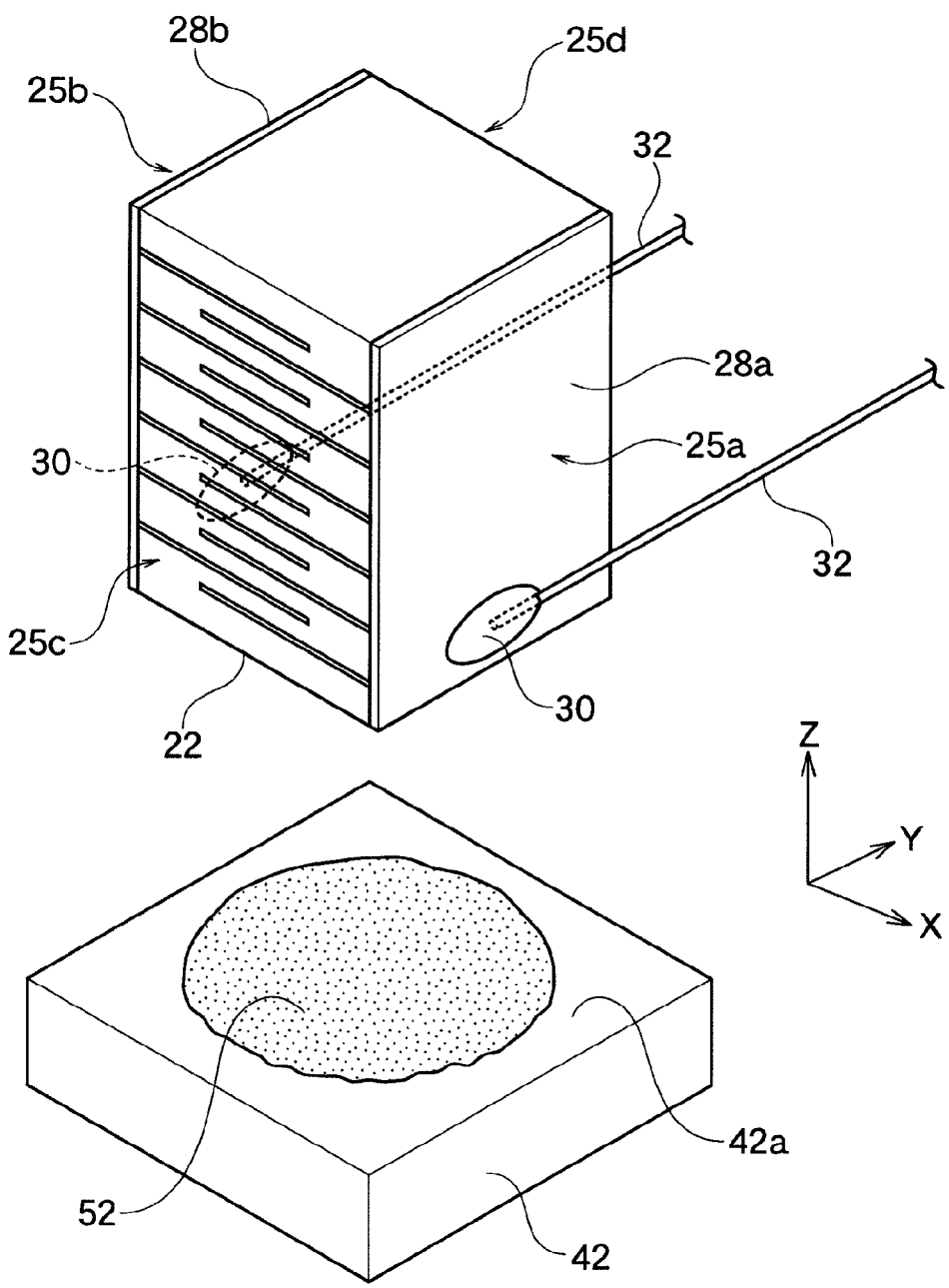
FIG. 4 is a perspective view showing a manufacturing process of the piezoelectric element unit shown in FIG. 1 and FIG. 2.

The electric connection part 30 fixing tips of the wiring part 32 to the first external electrode 28a may be placed on any position of the first side surface 25a, where the first external electrode 28a is formed. In the piezoelectric element unit 10 according to the present embodiment, the electric connection parts 30 are placed nearer to the weight 42 than the center in the laminating direction of the element body 20. As shown in FIG. 4, to securely join the first external electrode 28a, the electric connection part 30 is placed around the central part in the Y-axis direction vertical to the laminating direction of the first side surface 25a, where the first external electrode 28a is formed.

The electric connection part 30 is contacted to near a tip of the wiring part 32 and to the surface of the first external electrode 28a, and electrically and physically connects the tip of the wiring part 32 and the first external electrode 28a. Note that, core wires are exposed by removal of wire coating (insulation coat) around the tips of the wiring parts 32 covered by the electric connection parts 30.

As shown in FIG. 1 and FIG. 2, the shaft 44 is connected with an upper first resin part 52b to a second end surface 24 of the other end surface in the laminating direction of the element body 20. A second mounting surface 44a of the shaft 44 is placed to face the second end surface 24 of the element body 20. The upper first resin part 52b joins the second end surface 24 and the second mounting surface 44a. The upper first resin part 52b is preferably composed of the same resin as the lower first resin part 52a, but it is not necessarily the same.

In the piezoelectric element unit 10, material of each member attached to the element body 20 is not particularly limited. For example, the shaft 44 may be composed of such as metallic material of SUS or so to preferably support the movable member 56. The weight 42 preferably includes such as metallic material with a relatively large specific gravity of tungsten or so to preferably function as an inertial body for providing the shaft 44a with displacement, but material of the weight 44 is not particularly limited.

As the wiring part 32, a lead wire or so having a core wire composed of conductive material such as copper and a coating film for coating the core wire may be used, but it is not particularly limited. The core wire of the wiring part 32 may be a single wire or a stranded wire. The electric connection parts 30 are not particularly limited as long as they are material of solder used for electricity or so.

In the present embodiment, as shown in FIG. 2, the element body 20 includes an active part 26a and first and second inactive parts 26b1 and 26b2. In the active part 26a, the piezoelectric layers 26 and the internal electrodes 27a and 27b are alternatively laminated. The first and second inactive parts 26b1 and 26b2 are laminated both ends in the laminating direction of the active part 26a. Each of the inactive parts 26b1 and 26b2 is defined as an insulator layer where neither the internal electrodes 27a nor 27b exist. The insulator layers constituting the inactive parts 26b1 and 26b2 are preferably composed of the same material as the piezoelectric layers 26 constituting the active part 26a, but are not necessarily composed of the same material.

A Z-axis direction length Z0 of the active part 26a is determined by such as a thickness of the piezoelectric layers 26 and the number of the internal electrodes 27a and 27b, and is not particularly limited. A length Z1 in the Z-axis direction of the first inactive part 26b1 located below in the Z-axis direction is not particularly limited. The length Z1 is determined to obtain a thickness of the inactive part 26b1 enough to protect the internal electrode 27a or 27b of the most outer layer located at a first interface 26c1 between the active part 26a and the lower first inactive part 26b1. A length Z2 in the Z-axis direction of the second inactive part 26b2 located above in the Z-axis direction is not particularly limited. The length Z2 is determined to obtain a thickness of the second inactive part 26b2 enough to protect the internal electrode 27a or 27b of the most outer layer located at a second interface 26c2 between the active part 26a and the second inactive part 26b2. The length Z1 and Z2 may be the same or different.

In the present embodiment, the lower first resin part 52a for bonding the mounting surface 42a of the weight 42 and the end surface 22 of the element body 20 covers the mounting surface 42a up to the outer side surfaces 25a to 25d of the element body 20 corresponding to the first interface 26c1. Especially in the present embodiment, as shown in FIG. 2, the electric connection parts 30 are located within a range of the Z-axis direction length Z1 of the lower first inactive part 26b1, and the lower first resin part 52a also covers an outer circumference of the electric connection parts 30.

The lower first resin part 52a also covers the exterior of the external electrodes 28a and 28b at a position within the range including from the lower first inactive part 26b1 to the first interface 26c1 along the Z-axis direction. Further, the lower first resin part 52a also integrally and continuously covers lower parts of the third side surface 25c and the third side surface 25d of the element body 20 shown in FIG. 5 at a position within a range including from the first inactive part 26b1 to the first interface 26c1 shown in FIG. 2 along the Z-axis direction.

In the present embodiment, the upper first resin part 52b for bonding the mounting surface 44a of the shaft 44 and the end surface 24 of the element body 20 covers the mounting surface 44a up to the outer side surfaces 25a to 25d of the element body 20 corresponding to the second interface 26c2.

The upper first resin part 52b also covers the exterior of the external electrodes 28a and 28b at a position within a range including from the upper second inactive part 26b2 to the second interface 26c2 along the Z-axis direction. Further, the upper first resin part 52b also integrally and continuously covers upper parts of the third side surface 25c and the third side surface 25d of the element body 20 shown in FIG. 3 at a position within a range including from the second inactive part 26b2 to the second interface 26c2 shown in FIG. 2 along the Z-axis direction.

Further, in the present embodiment, the second resin parts 53 cover outer surfaces of the first resin parts 52a and 52b covering outer side surfaces 25a to 25d of an element body 20 at positions corresponding to a first interface 26c1 and a second interface 26c2. The second resin parts 53 integrally cover the outer side surfaces 25a to 25d of the element body 20 corresponding to the active part 26a as well.

In the present embodiment, the kind of resin and the compounding ratio of each component are preferably adjusted to make elastic modulus of the first resin parts 52a and 52b larger than that of the second resin parts 53. The elastic modulus of the second resin parts 53 is preferably 0.1 to 3 GPa. As a resin constituting the second resin parts 53, epoxy resin, silicone resin, acrylic resin, urethane resin, imide resin, and the like are exemplified.

The first resin parts 52a and 52b are preferably mutually composed of the same resin, but they may not be necessarily composed of the same resin. As the resin constituting the first resin parts 52a and 52b, epoxy resin, acrylic resin, phenol resin, amino resin, imide resin and the like are exemplified. As a resin constituting the first resin parts 52a and 52b, it preferably has elastic modulus which is one to 60 times or more larger than that of the resin constituting the second resin parts 53.

Neither a thickness of the first resin parts 52a, 52b nor a thickness of the second resin parts 53 is particularly limited, but they are preferably 0.05 to 1 mm at positions corresponding to the first interface 26c1 and the second interface 26c2.

Figure 5:
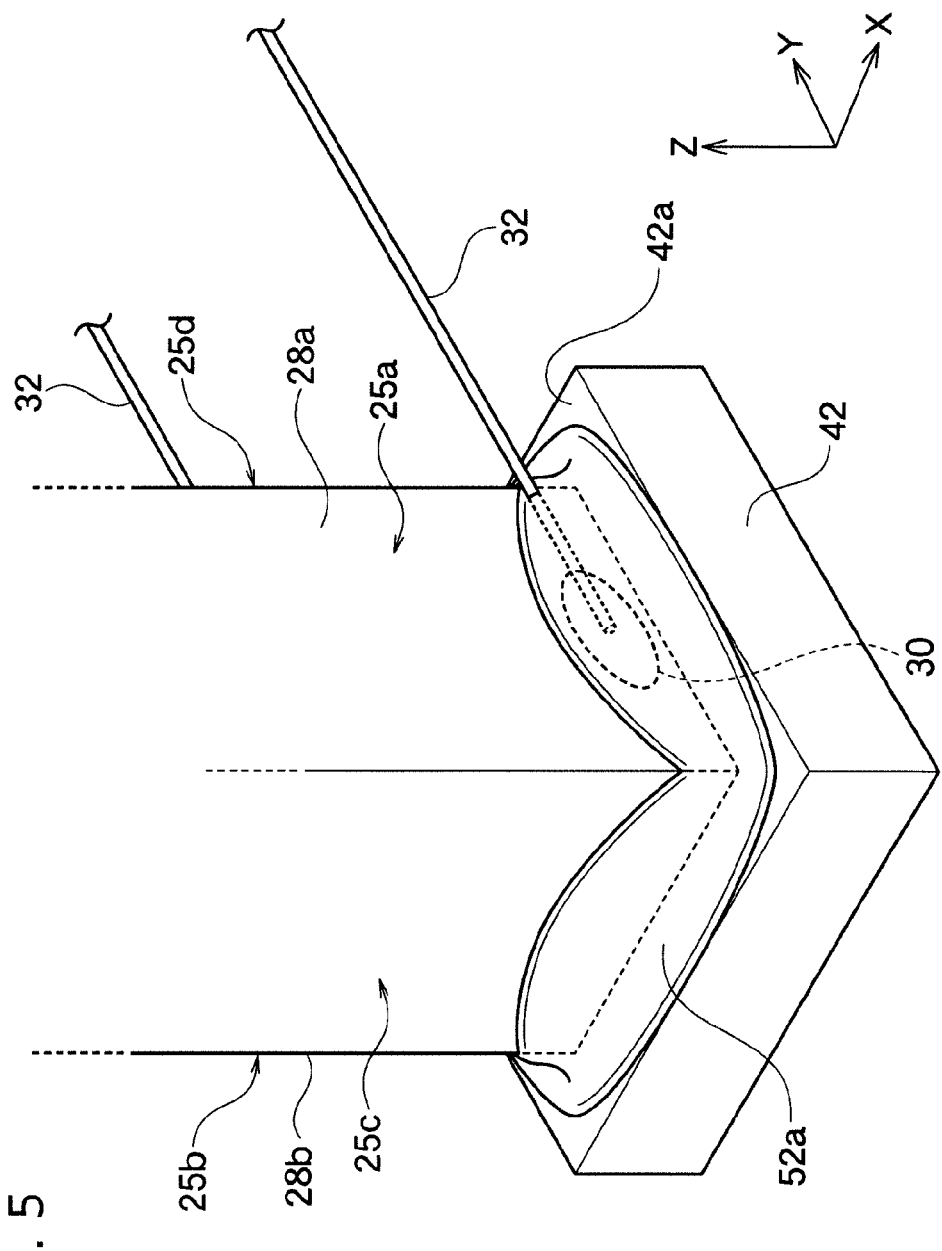
FIG. 5 is a partial perspective view showing a continuous step of FIG. 4.

Hereinafter, with FIG. 3 to FIG. 5, an example of the method for manufacturing the piezoelectric element unit 10 will be described.

First, the element body 20 as shown in FIG. 3 is prepared in the method for manufacturing the piezoelectric element unit 10. First, in a manufacturing step of the element body 20, green sheets in which internal electrode paste films of a predetermined pattern to be the first internal electrodes 27a and the second internal electrodes 27b after firing are formed and green sheets having no internal electrode paste films are prepared.

The green sheets are prepared as the following method, for example. First, calcination powder including source material constituting the piezoelectric layers 26 is slurried by adding binder thereto. Next, the green sheets having no internal electrode paste films are obtained by forming the slurry into a sheet with a doctor blade method or a screen print method etc. and drying it. Further, the green sheets with internal electrode paste films of a predetermined pattern are obtained by coating internal electrode paste including the above-mentioned conductive material on the green sheets with a printing method or so. Note that, the source material constituting the piezoelectric layers 26 may include inevitable impurities.

After preparing the respective green sheets, a laminated body is obtained by laminating the prepared green sheets, adhering them by pressing, performing required steps such as a dry step, and cutting them.

Next, after obtaining a sintered body by firing the obtained laminated body under a predetermined condition, the first external electrode 28a and the second external electrode 28b are formed on portions corresponding to the first side surface 25a and the second side surface 25b of the sintered body. Then, polarization treatment of the piezoelectric layers 26 is performed by applying DC voltage to the electrodes. Thereafter, the strip-shaped sintered body after the polarization treatment is cut to each element body, and the element body 20 as shown in FIG. 3 is obtained. Note that, R-surface treatment may be applied to corner and ridge parts of the obtained element body 20 by performing barrel polishing thereto.

Next, as shown in FIG. 4, the wiring parts 32 are connected to the element body 20. In this case, at first, core wires are exposed by removing coating of tips of the wiring parts 32. Then, preliminary soldering is performed for predetermined positions of the first and second external electrodes 28a, 28b and the core wires. Finally, the preliminary solder of the external electrodes 28a and 28b are melted while the electrodes 28a, 28b and the core wires are contacted. As a result, the electric connection parts 30 can be formed. Note that, the electric connection parts 30 may be formed by a conductive adhesive agent instead of solder.

Next, the first resin part 52a as shown in FIG. 2 is formed by heating the first end surface 22 of the element body 20 with the electric connection parts 30 after pressing it to the first mounting surface 42a of the weight 42, where a thermosetting adhesive agent 52 to be the first resin part 52a is applied. In this case, an amount of the thermosetting adhesive agent 52 applied on the first mounting surface 42a of the weight 42 is not only necessary for fixing the first end surface 22 with the first mounting surface 42a, but is adjusted for the first resin part 52a formed after the curing to cover the electric connection parts 30 and extend up to a position of the first interface 26c1 shown in FIG. 2.

As shown in FIG. 2, with the similar thermosetting adhesive agent 52, a second mounting surface 44a of the shaft 44 is fixed to the second end surface 24 of the element body 20, and the first resin layer 52b joining the second end surface 24 and the second mounting surface 44a is formed in the same manner as the first end surface 22. An amount of the adhesive agent constituting the first resin layer 52b is not only necessary for fixing the second end surface 24 to the second mounting surface 44a, but is adjusted for the first resin part 52b formed after the curing to extend down to a position of the second interface 26c2.

Thereafter, a resin solution constituting the second resin parts 53 after the curing is cured by being coated on the whole surfaces of the four side surfaces 25a to 25d of the element body 20. The resin solution constituting the second resin parts 53 is painted to integrally coat not only the outer surfaces of the first resin parts 52a and 52b, but the outer side surfaces 25a to 25d of the element body 20 corresponding to the active part 26a at positions corresponding to the first interface 26c1 and the second interface 26c2.

Note that, in the above explanation, the thermosetting adhesive agent is used as an adhesive agent to connect the element body 20 to both the weight 42 and the shaft 44 as joint members connected thereto. However, the adhesive agent for a manufacture of the piezoelectric element unit is not limited thereto.

In the piezoelectric element unit 10 of the present embodiment, as shown in FIG. 2, the outer side surfaces 25a to 25d of the element body 20 are doubly covered by both the first resin parts 52a, 52b and the second resin parts 53 at positions corresponding to the interfaces 26c1 and 26c2 between the active part 26a and the inactive parts 26b1, 26b2. That is, in the piezoelectric element unit 10 of the present embodiment, the most weakened part of the element body 20 is doubly covered by both the first resin parts 52a, 52b and the second resin parts 53. Thus, with a simple structure, a mechanical strength (e.g., bending strength) of the element body 20 can be improved, the element body 20 is hard to be broken, and durability thereof is improved.

The first resin parts 52a and 52b also join the element body 20 to the weight 42 or the shaft 44 as a joint member, which allows the piezoelectric element unit 10 according to the present embodiment to have a simple structure, easy manufacturing, and excellent reliability.

Further, the second resin parts 53 integrally cover the outer side surfaces 25a to 25d of the element body 20 corresponding to the active part 26a as well. Thus, a boundary between rim parts of the first resin parts 52a, 52b and the outer side surfaces of the element body 20 is covered by the second resin parts 53. As a result, the rim parts of the first resin parts 52a and 52b can be prevented from peeling off from the outer side surfaces of the element body 20. The second resin parts 53 also integrally cover the outer side surfaces of the element body 20 corresponding to the active part 26a, which improves humidity resistance.

In the present embodiment, the following effects are demonstrated by making the elastic modulus of the first resin parts 52a and 52b larger than that of the second resin parts 53. That is, the element body 20 is caused to move in the Z-axis direction by voltage applied to internal electrodes 27a and 27b at the active part 26a of the element body 20, but the move does not occur at inactive parts 26b1 and 26b2. Then, with a low elastic modulus of the second resin parts 53, it becomes easier for the second resin parts 53 to follow the move of the active part 26a, and durability of the second resin parts 53 is improved. Further, the first resin parts 52a, 52b located at the inactive parts 26b1, 26b2 also join the element body 20 to the weight 42 or a shaft 44, which allows a harder one compared with the second resin parts 53 to join them firmly. In addition, there is no problem even if the first resin parts 52a and 52b are hard because the inactive parts 26b1 and 26b2 themselves do not move.

Further, in the present embodiment, the external electrodes 28a and 28b are formed respectively on the two opposite side surfaces 25a and 25b of the element body 20, and the second resin parts 53 may also cover the outer surfaces of the external electrodes 28a and 28b. By having such a structure, the external electrodes 28a and 28b are effectively protected, and gas corrosion of the external electrodes 28a and 28b or so can be prevented.

Further, in the present embodiment, the tips of the wiring parts 32 as lead parts for wiring are fixed by the electric connection parts 30 to nearby the mounting surface 42a on the outer surfaces of the external electrodes 28a and 28b, and the electric connection parts 30 are doubly covered by the first resin part 52a and the second resin parts 53. By having such a structure, strength of the element body is also improved at the electric connection parts 30.

Further, the first resin part 52a covers the electric connection part 30 elevated from the first external electrode 28a. Thus, when a force detaching the element body 20 and the weight 42 is worked, the electric connection parts 30 function as an anchor for maintaining connection between the first resin part 52a and the element body 20. Therefore, the piezoelectric element unit 10 has a high reliability in connection between the element body 20 and the weight 42 and demonstrates a preferable durability. Further, the first resin part 52a covers the electric connection parts 30, so that the first resin part 52a has a function to protect and reinforce a connection interface between the electric connection part 30 and the first external electrode 28a and a connection interface between the electric connection parts 30 and the wiring parts 32. Therefore, the piezoelectric element unit 10 also has a high reliability in the connection between the wiring parts 32 and the first and second external electrodes 28a, 28b.

Note that, the first resin part 52a may cover at least a part of the wiring parts 32 extending from the electric connection parts 30. The coating of the core wires may be removed around the tips of the wiring parts 32 for soldering, and the rest of the coating may be damaged by heat during the soldering. However, the first resin part 52a coats a part of the wiring parts 32 adjacent to the electric connection parts 30, which securely prevents the core wires of the wiring parts 32 from directly contacting the weight 42 or so and can securely prevent a problem of a short circuit or so.

Second Embodiment

Figure 6A:
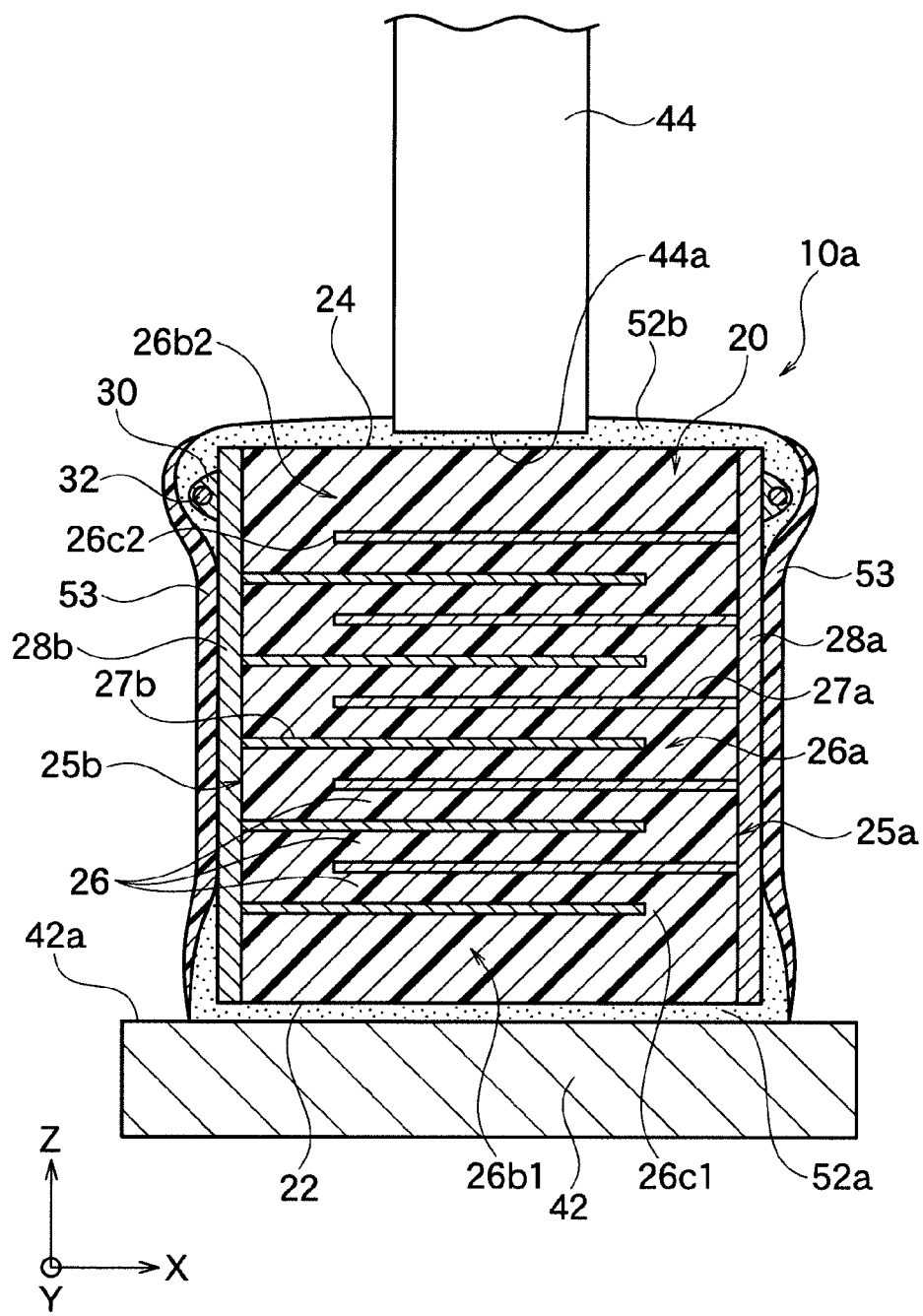
FIG. 6A is an enlarged cross sectional view of a main part of a piezoelectric element unit according to another embodiment of the present invention.

In a piezoelectric element unit 10a of the present embodiment, as shown in FIG. 6A, electric connection parts 30 connecting wire parts 32 and external electrodes 28a and 28b are formed on outer surfaces of the external electrodes 28a and 28b corresponding to a second inactive part 26b2 located near a second end surface 24. An upper first resin part 52b covers not only circumferences of the electric connection parts 30, but also covers a mounting surface 44a up to outer side surfaces 25a to 25d of an element body 20 corresponding to a second interface 26c2. Of course, when the external electrodes 28a and 28b exist, the upper first resin part 52b also covers the exterior thereof.

Further, in the present embodiment, a lower first resin part 52a for bonding a mounting surface 42a of a weight 42 and an end surface 22 of the element body 20 covers the mounting surface 42a up to the outer side surfaces 25a to 25d of the element body 20 corresponding to a first interface 26c1. Of course, when the external electrodes 28a and 28b exist, the lower first resin part 52a also covers the exterior thereof.

Further, in the present embodiment, second resin parts 53 cover outer surfaces of the first resin parts 52a and 52b covering the outer side surfaces 25a to 25d of the element body 20 at positions corresponding to the first interface 26c1 and the second interface 26c2. The second resin parts 53 integrally cover the outer side surfaces 25a to 25d of the element body 20 corresponding to an active part 26a as well. In the present embodiment, the second resin parts 53 also cover an outer surface of the upper first resin part 52b corresponding to the electric connection parts 30.

Other structures of the second embodiment are the same as those of the piezoelectric element unit 10 according to the first embodiment and demonstrate similar effects.

Third Embodiment

Figure 6B:
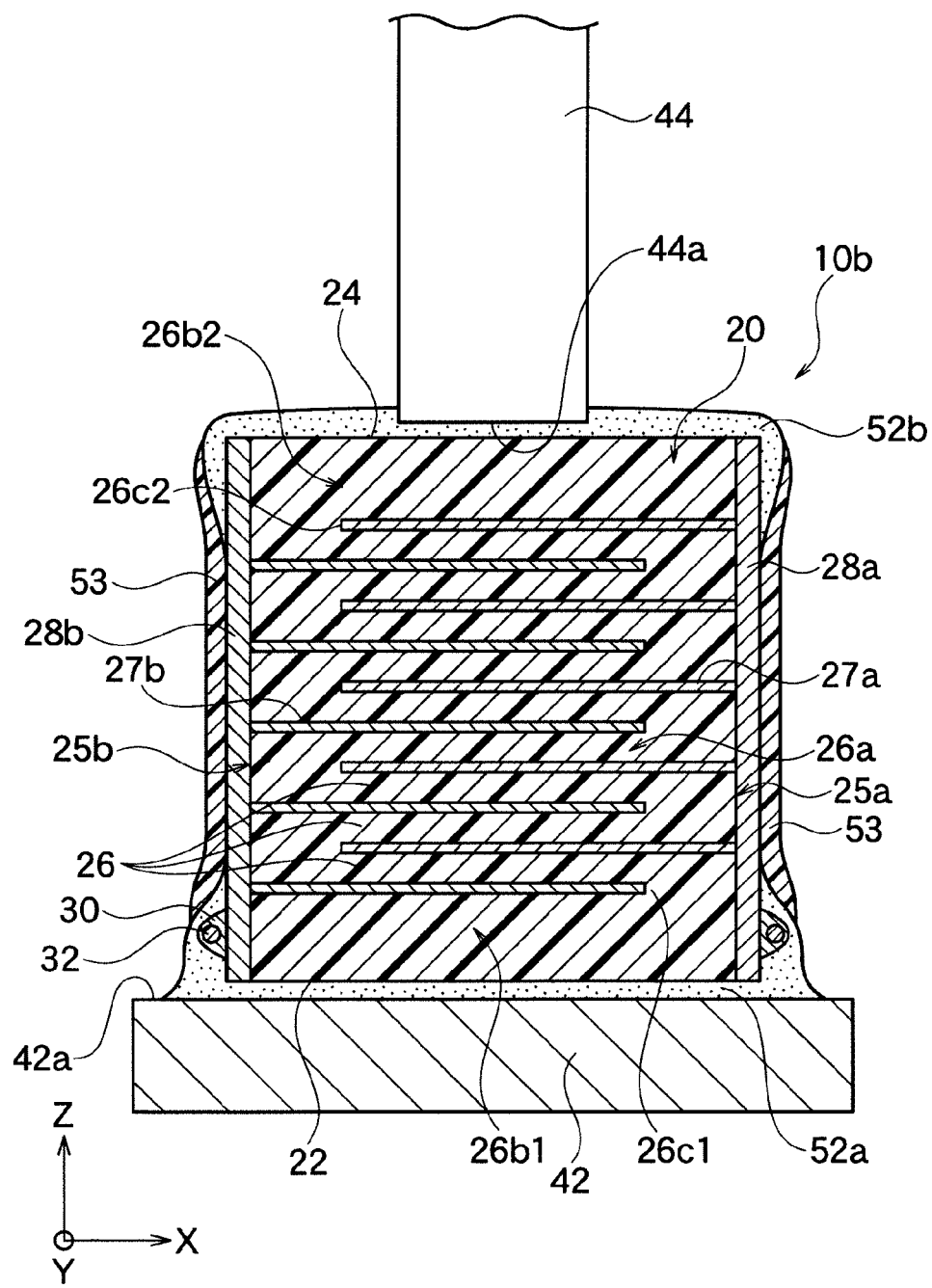
FIG. 6B is an enlarged cross sectional view of a main part of a piezoelectric element unit according to further another embodiment of the present invention.

A piezoelectric element unit 10b of an embodiment shown in FIG. 6B is a variation of the piezoelectric element body 10 of the first embodiment. In the present embodiment, unlike the first embodiment, second resin parts 53 do not cover the exterior of a first resin part 52a at positions corresponding to electric connection parts 30. Note that, the second resin parts 53 cover outer surfaces of the first resin parts 52a and 52b, which cover outer side surfaces 25a to 25d of an element body 20 at positions corresponding to a first interface 26c1 and a second interface 26c2.

Other structures of the third embodiment are the same as those of the piezoelectric element unit 10 according to the first embodiment and demonstrate similar effects.

Fourth Embodiment

Figure 6C:
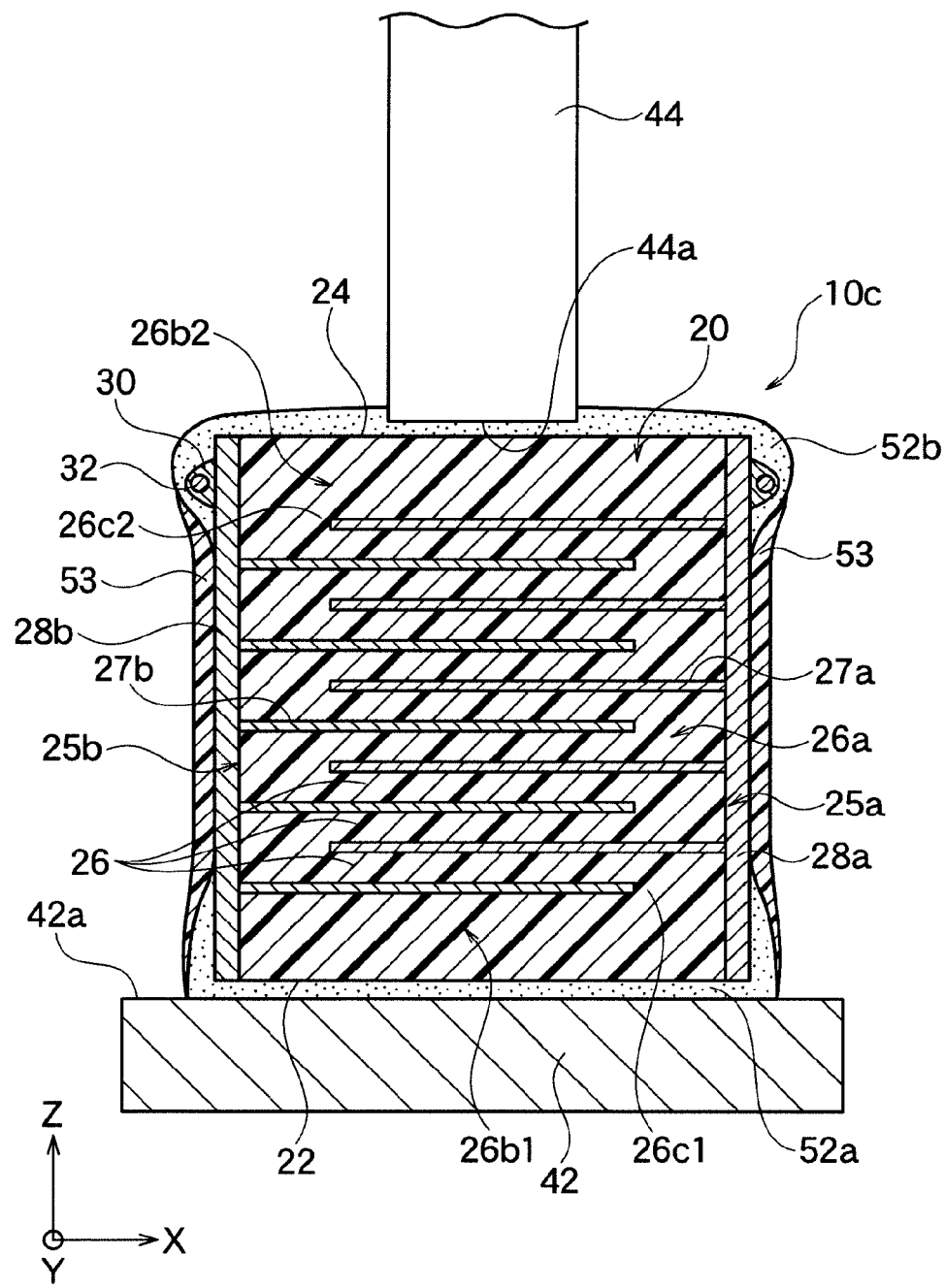
FIG. 6C is an enlarged cross sectional view of a main part of a piezoelectric element unit according to further another embodiment of the present invention.

A piezoelectric element unit 10c of an embodiment shown in FIG. 6C is a variation of the piezoelectric element body 10a of the second embodiment shown in FIG. 6A. In the present embodiment, unlike the second embodiment, second resin parts 53 do not cover the exterior of a first resin part 52a at positions corresponding to an electric connection part 30. Note that, the second resin parts 53 cover outer surfaces of the first resin parts 52a and 52b, which cover outer side surfaces 25a to 25d of an element body 20 at positions corresponding to a first interface 26c1 and a second interface 26c2.

Other structures of the fourth embodiment are the same as those of the piezoelectric element unit 10 according to the first embodiment and demonstrate similar effects.

Fifth Embodiment

Figure 6D:
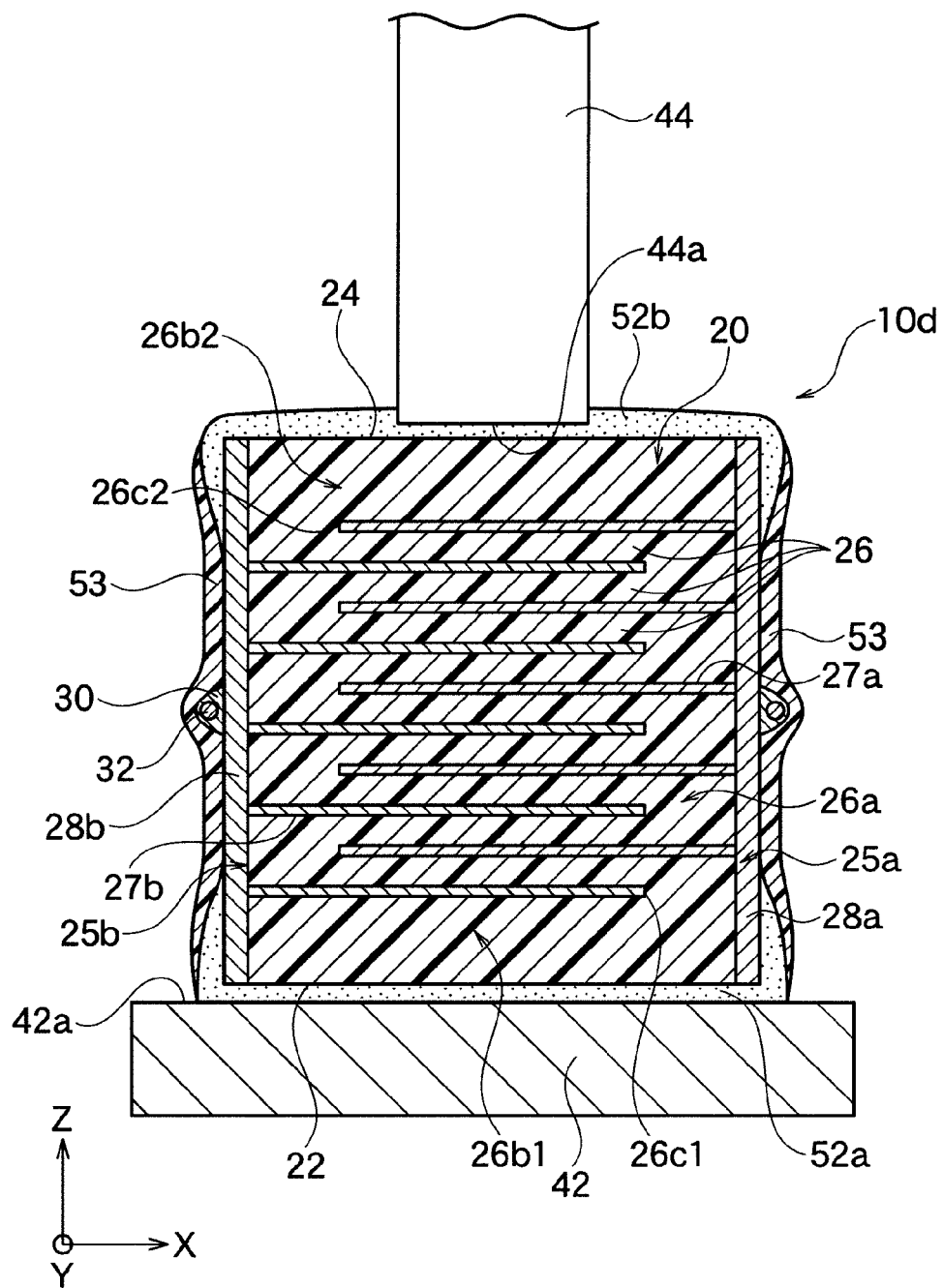
FIG. 6D is an enlarged cross sectional view of a main part of a piezoelectric element unit according to further another embodiment of the present invention.

As shown in FIG. 6D, in a piezoelectric element unit 10d of the fifth embodiment, tips of wiring parts 32 as lead parts for wiring are fixed by electric connection parts 30 on outer surfaces of external electrodes 28a and 28b at a position corresponding to an active part 26a. The electric connection parts 30 are covered by second resin parts 53 without first resin parts 52a and 52b. By having such a structure, strength of the element body 20 is also improved at the electric connection parts 30.

Other structures of the fifth embodiment are the same as those of the piezoelectric element unit 10 according to the first embodiment and demonstrate similar effects.

Sixth Embodiment

Figure 6E:
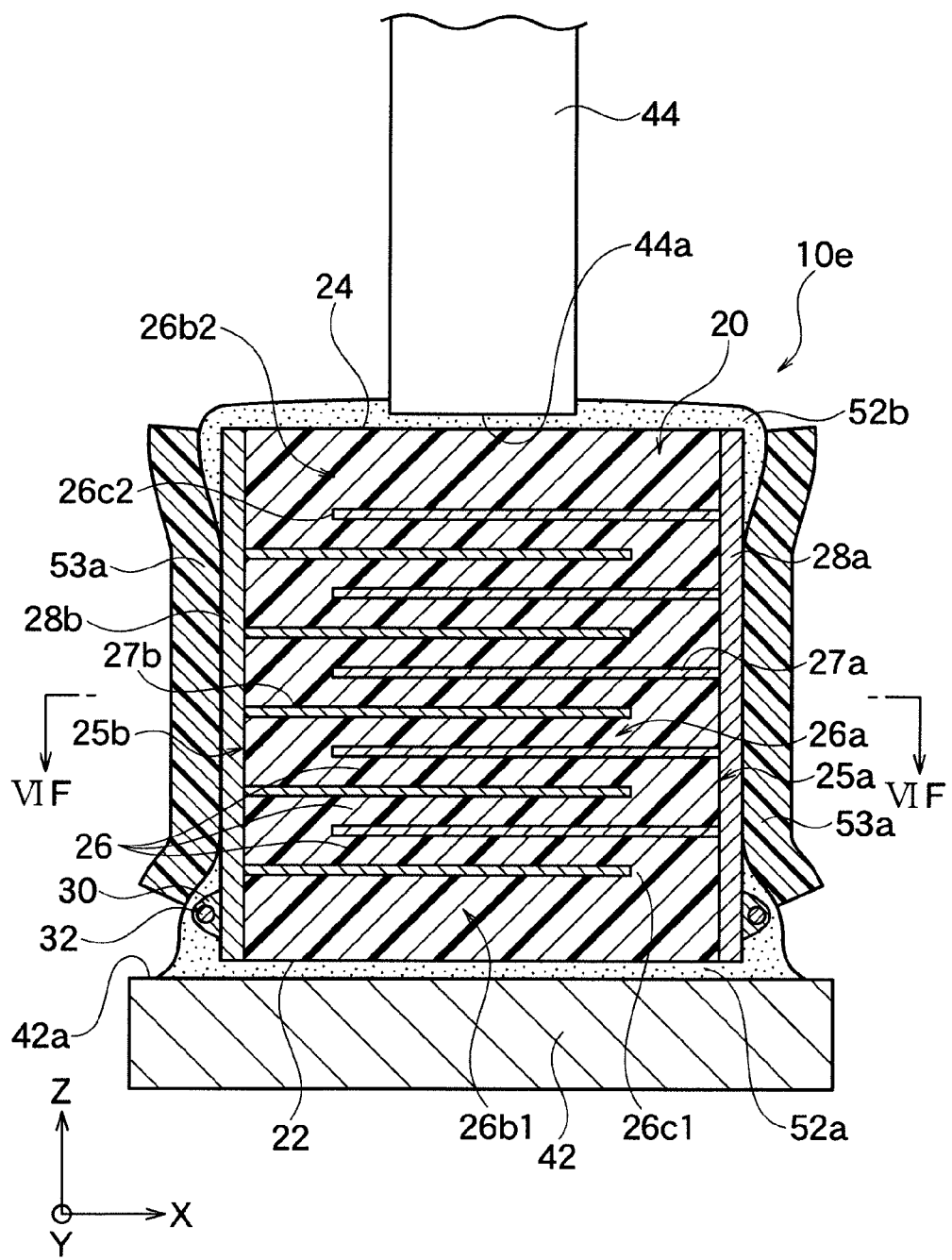
FIG. 6E is an enlarged cross sectional view of a main part of a piezoelectric element unit according to further another embodiment of the present invention.

As shown in FIG. 6E, in a piezoelectric element unit 10e of the sixth embodiment, a heat shrinkable tube 53a is attached as a second resin part instead of the second resin parts 53 shown in FIG. 6B mentioned above. The heat shrinkable tube 53a is a resin tube which shrinks when receiving energy such as heat, light, or electron beam. For example, the heat shrinkable tube 53a is composed of a resin such as polyvinyl chloride, polyvinylidene fluoride, polyolefin, polytetrafluoroethylene, FEP, PFA, silicone, or PEEK material etc. The heat shrinkable tube 53a may be composed of a single layer or multiple layers. An adhesive layer may be formed on an inner circumferential surface of the heat shrinkable tube 53a.

In order to attach the heat shrinkable tube 53a to the position shown in FIG. 6E, a weight 42 or a shaft 44 may be inserted into the tube 53a before shrinking, and the tube 53a may be shrunk in a radial direction by adding heat or so thereto at the position shown in FIG. 6E, where an element body 20 is located inside of the tube 53a.

Figure 6F:
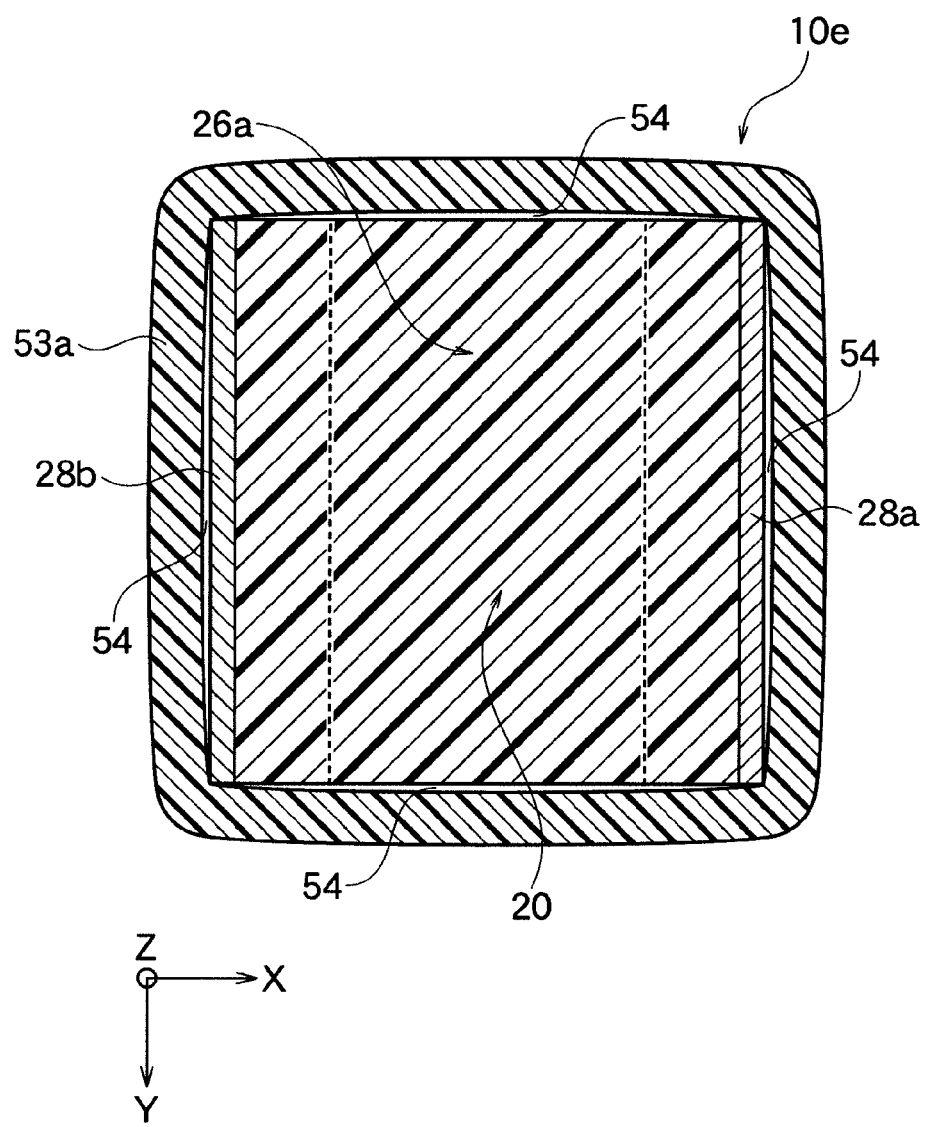
FIG. 6F is a cross sectional view of a main part taken along VIF-VIF shown in FIG. 6E.

In that case, as shown in FIG. 6F, at least four corners of the element body 20 are tightly contacted with an inner circumference of the tube 53a. There is no problem even if some space 54 is in between four side surfaces of the element body 20 and the inner circumference surface of the heat shrinkable tube 53a. Rather, this may be good because an active part 26a, which deforms in the Z-axis direction, is not disturbed to move so. Note that, when the adhesive layer is formed on the inner circumference surface of the heat shrinkable tube 53a, the space 54 is occupied by the adhesive layer, and the inner circumference surface of the tube 53a is also adhered to the four side surfaces of the element body 20. In that case, humidity resistance of the element body 20 can be improved, for example.

Compared with the second resin parts 53 formed by painting or coating method etc., the heat shrinkable tube 53a can be formed to be thick and uniform. For example, a thickness of the heat shrinkable tube 53a can be 100 to 500 μm or more, while a thickness of the second resin parts 53 formed by painting or coating method etc. is tens of μm. In particular, as shown in FIG. 6F, the thickness of the heat shrinkable tube 53a hardly becomes thin even at the corners of the element body 20. On the other hand, resin parts formed by painting or coating method etc. have a problem that a thickness of the element body 20 becomes thinner at the corners.

In the present embodiment, the thickness of the heat shrinkable tube 53a hardly becomes thin even at the corners of the element body 20. Thus, a mechanical strength (e.g., bending strength) of the element body 20 can be further improved, the element body 20 is hard to be broken, and durability thereof is further improved. Note that, in the present embodiment, a single heat shrinkable tube 53a is used, but a plurality of the heat shrinkable tubes 53a may be used by laminating themselves. In that case, a mechanical strength (e.g., bending strength) of the element body 20 can be further improved, the element body 20 is further hard to be broken, and durability thereof is further improved.

In the above embodiment, the heat shrinkable tube 53a is used as the second resin part instead of the second resin parts 53 of the third embodiment shown in FIG. 6B mentioned above. However, the heat shrinkable tube 53a can be used instead of the second resin parts 53 according to the all embodiments.

Other structures of the sixth embodiment are the same as those of the piezoelectric element unit 10 according to the first to fifth embodiments and demonstrate similar effects.

Note that, the present invention is not limited to the above-mentioned embodiments, but can be variously changed within the scope thereof.

For example, in the present invention, the positions of the electric connection parts 30 formed on the surfaces of the external electrodes 28a and 28b are not limited to those of the illustrated embodiments and can be changed based on a device to which the piezoelectric element unit 10 is applied. Also, in the above embodiments, members are joined at both sides in the Z-axis direction of the element body 20, but the members driven by the element body may be joined to either one of the both sides.

Hereinafter, the present invention will be described based on more detailed example, but it is not limited thereto.

Example 1

Figure 7A:
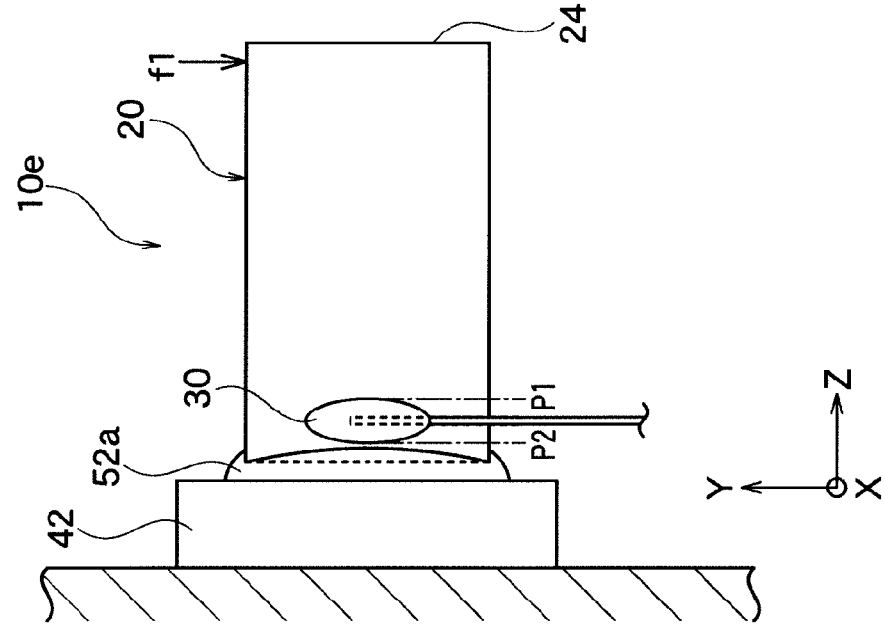
FIG. 7A is a conceptual view showing a measuring method of bending strength of the piezoelectric element unit according to the example of the present invention.
Figure 7B:
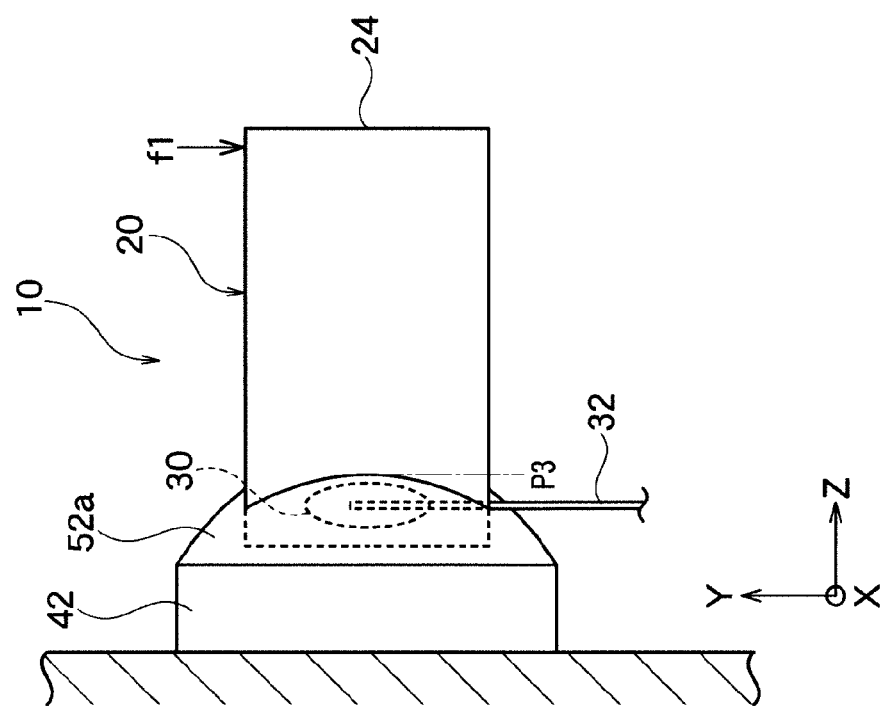
FIG. 7B is a conceptual view showing a measuring method of bending strength of the piezoelectric element unit according to the reference example of the present invention.

FIG. 7A is a conceptual view showing a piezoelectric element unit 10 according to one example of the present invention. FIG. 7B is a conceptual view showing a piezoelectric element unit 10e according to a reference example of the present invention. The piezoelectric element unit 10 shown in FIG. 7A is one according to the first embodiment described with FIG. 1 to FIG. 5. The size of an element body 20 used with the piezoelectric element unit 10 of this example is 1.0 mm×1.0 mm×1.5 mm.

The piezoelectric element unit 10e according to the reference example is different from the piezoelectric element unit 10 according to the example as follows. A first resin part 52a connecting a weight 42 and the element body 20 covers neither an electric connection part 30 nor side surfaces of the element body 20 corresponding to an interface 26c1 shown in FIG. 2. Further, the piezoelectric element unit 10e according to the reference example is different from the piezoelectric element unit 10 according to the example in that second resin parts 53 shown in FIG. 2 are not formed.

Other structures of the reference example are the same as those of the piezoelectric element unit 10. Note that, the first resin part 52a of the piezoelectric element unit 10e according to the reference example was formed by reducing an usage amount of a thermosetting adhesive agent used for forming the first resin part 52a compared with that of the piezoelectric element unit 10 according to the example.

Figure 8:
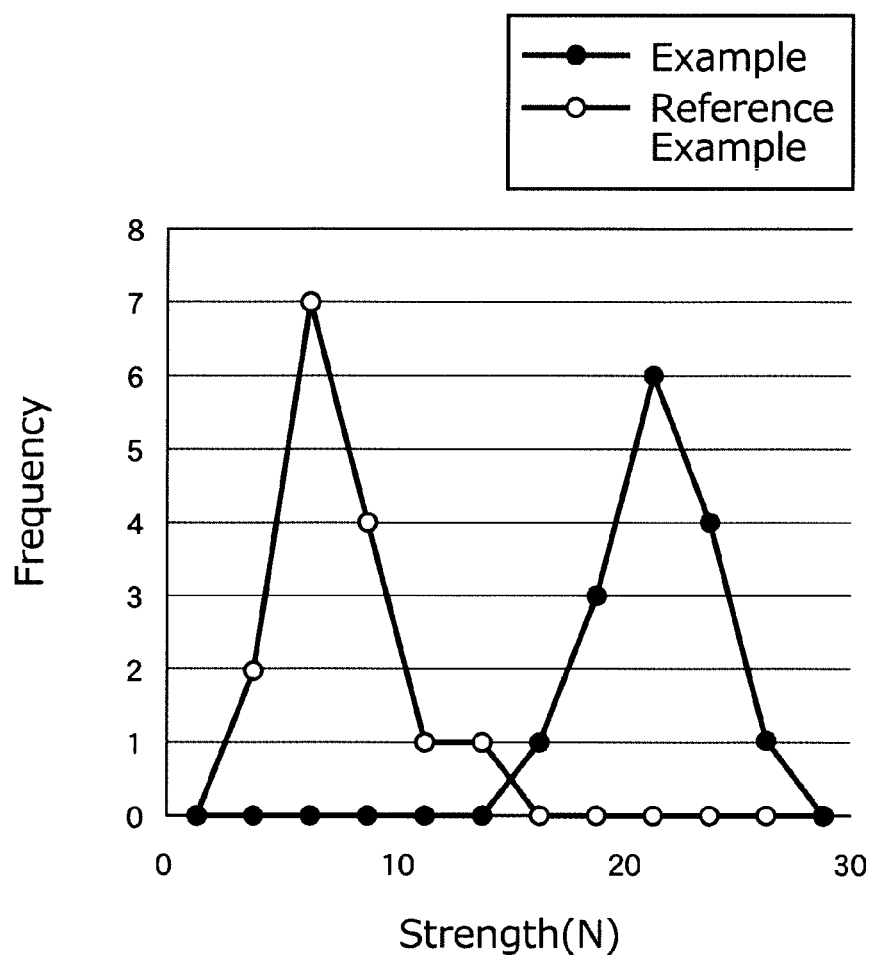
FIG. 8 is a graph showing a measuring result of bending strength of the piezoelectric element unit according to the example and the reference example of the present invention.

As shown in FIG. 7A and FIG. 7B, under a state where the weight 42 is fixed to the piezoelectric element unit 10 and the piezoelectric element unit 10e, a force f1 in a direction (Y-axis) vertical to a laminating direction (Z-axis) of the element body 20 was added on to nearby a second end surface 24 of the element body 20. Then, the force f1 (strength) at the time of fracture of the element body 20 was measured. FIG. 8 shows the measurement result with respective 13 samples of the piezoelectric element unit 10 according to the example and the piezoelectric element unit 10e according to the reference example.

In FIG. 8, the horizontal axis represents strength of the samples (force f1 at the time of fracture of the element body 20), and the vertical axis represents frequency. FIG. 8 shows that, compared with strength distribution of the piezoelectric element unit 10e according to the reference example, strength distribution of the piezoelectric element unit 10 according to the example is moved to the right side of the graph, and that the piezoelectric element unit 10 according to the example has strength higher than that of the piezoelectric element unit 10e according to the reference example.

In the piezoelectric element unit 10e according to the reference example, the element body 20 was broken around positions P1 and P2 (especially, around P1), which are boundaries of the electric connection part 30. On the other hand, in the piezoelectric element unit 10 according to the example, the element body 20 was broken around a position P3, which is a boundary of the first resin part 52a.

In the piezoelectric element unit 10e according to the reference example, since the electric connection part 30 is formed, a stress was generated around a portion where the electric connection part 30 and the element body 20 were contacted. It is considered that the stress made a weakened part around the positions P1 and P2 of the boundary of the electric connection part 30, and that the weakened part had something to do with the fracture. Especially, the position P1 approximately corresponds to a position of the first interface 26c1 shown in FIG. 2, and the position is considered to be weakened.

On the other hand, in the piezoelectric element unit 10 according to the example, it is considered that the first resin part 52a and the second resin parts 53 reinforced not only around the electric connection part 30 but also the first interface 26c1 shown in FIG. 2, and that bending strength thereof was improved.

When the piezoelectric element unit 10 is employed to a lens driving device 60 as shown in FIG. 1, the piezoelectric element unit 10 is required to have strength and durability for supporting a movable member 56. Thus, the piezoelectric element unit 10 according to the example, which prevents fracture of the element body 20 including a relatively weakened piezoelectric material and has an enhanced bending strength, can be particularly preferably used as a driving device of the lens driving device 60.

NUMERICAL REFERENCES

10 . . . piezoelectric element unit
20 . . . element body
22 . . . first end surface
24 . . . second end surface
25a . . . first side surface
25b . . . second side surface
25c . . . third side surface
25d . . . fourth side surface
26 . . . piezoelectric layer
26a . . . active part
26b1, 26b2 . . . inactive part
26c1, 26c2 . . . interface
27a . . . first internal electrode
27b . . . second internal electrode
28a . . . first external electrode
28b . . . second external electrode
30 . . . electric connection part
32 . . . wiring part
42 . . . weight
42a . . . first mounting surface
44 . . . shaft
44a . . . second mounting surface
52 . . . thermosetting adhesive agent
52a, 52b . . . first resin part
53 . . . second resin part
53a . . . heat shrinkable tube
54 . . . space
56 . . . movable member
58 . . . driving circuit
60 . . . lens driving device

The invention claimed is:

1. A piezoelectric element unit comprising:
an element body having an active part in which piezoelectric layers and internal electrodes are laminated alternatively and an inactive part laminated at both ends of the active part in a laminating direction; and
a first resin part bonding one end surface in the laminating direction of the element body to a mounting surface of a joint member placed to face the one end surface, wherein
the first resin part covers the mounting surface up to an outer side surface of the element body corresponding to an interface between the active part and the inactive part,
a second resin part covers an outer surface of the first resin part covering the outer side surface of the element body at a position corresponding to the interface between the active part and the inactive part, and
the second resin part also integrally covers the outer side surface of the element body corresponding to the active part.

2. The piezoelectric element unit as set forth in claim 1, wherein
an elastic modulus of the first resin part is larger than that of the second resin part.

3. The piezoelectric element unit as set forth in claim 1, wherein
external electrodes are respectively formed on two opposite side surfaces of the element body and
the second resin part also covers outer surfaces of the external electrodes.

4. The piezoelectric element unit as set forth in claim 2, wherein
external electrodes are respectively formed on two opposite side surfaces of the element body and
the second resin part also covers outer surfaces of the external electrodes.

5. The piezoelectric element unit as set forth in claim 3, wherein
a lead part for wiring is fixed by an electric connection part to nearby the mounting surface on the outer surfaces of the external electrodes and
the electric connection part is doubly covered by the first resin part and the second resin part.

6. The piezoelectric element unit as set forth in claim 4, wherein a lead part for wiring is fixed by an electric connection part to nearby the mounting surface on the outer surfaces of the external electrodes and the electric connection part is doubly covered by the first resin part and the second resin part.

7. The piezoelectric element unit as set forth in claim 3, wherein a lead part for wiring is fixed by an electric connection part to the outer surfaces of the external electrodes corresponding to the active part and the electric connection part is covered by the second resin part.

8. The piezoelectric element unit as set forth in claim 4, wherein a lead part for wiring is fixed by an electric connection part to the outer surfaces of the external electrodes corresponding to the active part and the electric connection part is covered by the second resin part.

9. The piezoelectric element unit as set forth in claim 5, wherein the electric connection part is either a solder or a conductive adhesive agent.

10. The piezoelectric element unit as set forth in claim 6, wherein the electric connection part is either a solder or a conductive adhesive agent.

11. The piezoelectric element unit as set forth in claim 7, wherein the electric connection part is either a solder or a conductive adhesive agent.

12. The piezoelectric element unit as set forth in claim 8, wherein the electric connection part is either a solder or a conductive adhesive agent.

13. The piezoelectric element unit as set forth in claim 1, wherein the joint member is either a weight or a driving shaft.

14. The piezoelectric element unit as set forth in claim 1, wherein the second resin part is composed of a heat shrinkable tube.

15. A driving device comprising the piezoelectric element unit as set forth in claim 1.

* * * * *